United States Patent
Tsironis et al.

(10) Patent No.: US 8,405,405 B2
(45) Date of Patent: Mar. 26, 2013

(54) WIDEBAND I-V PROBE AND METHOD

(76) Inventors: Christos Tsironis, Kirkland (CA);
Zacharia Ouardirhi, St. Laurent (CA)

( * ) Notice: Subject to any disclaimer, the term of this patent is extended or adjusted under 35 U.S.C. 154(b) by 428 days.

(21) Appl. No.: 12/656,203

(22) Filed: Jan. 21, 2010

(65) Prior Publication Data

US 2011/0204906 A1   Aug. 25, 2011

(51) Int. Cl.
*G01R 27/04* (2006.01)
(52) U.S. Cl. .................... 324/638; 324/642; 324/750.01
(58) Field of Classification Search .......... 324/637–638, 324/642, 750.01
See application file for complete search history.

(56) References Cited

U.S. PATENT DOCUMENTS

| | | | |
|---|---|---|---|
| 7,135,941 B1 | 11/2006 | Tsironis | |
| 7,280,012 B2* | 10/2007 | Boulerne | 333/263 |
| 7,282,926 B1 | 10/2007 | Verspecht et al. | |
| 7,595,709 B1* | 9/2009 | Boulerne | 333/263 |
| 2006/0279275 A1 | 12/2006 | Simpson | |

OTHER PUBLICATIONS

US Provisional application "A dual directionsl coupler with adjustable coupling factor", J. Verspecht, C. Tsironis, J.P. Teyssier, F. Degroote.
"Large signal network analyzer uses . . . ", J.P.Teyssier, F. Degroote, proceedings of the ARFTG 2005.
Wikipedia, "Lissajous Curves".
Wikipedia, "Fast Fourier Transfomation".
Datasheet, "Oscilloscope Agilent, Infiniium Series 8000".
Datasheet, "Oscilloscope Tekronix, DSA8200".
TRL Calibration, Agilen Literature.
Product note 41, "Computer Controlled Microwaves Tuner," Focus Microwaves, Jan. 1998.

* cited by examiner

*Primary Examiner* — Arleen M Vazquez

(57) ABSTRACT

Low loss current and voltage probes are integrated in parallel plate airlines (slablines) to be used either as separate modules inserted between tuner and DUT in load pull test setups, or integrated in the impedance tuners themselves. The probes are inserted orthogonally at exactly the same reference plane relative to the DUT, maximizing bandwidth and the minimizing deformation of the detected electric and magnetic fields. The probes are used to detect the actual voltage and current waveforms and feed into an amplitude-and-phase calibrated high speed oscilloscope, including several harmonic frequencies. The actual real time voltage and current time domain waves are transformed into the frequency domain using fast Fourier transformation (FFT), de-embedded to the DUT reference plane and inverse transformed into the time domain using inverse Fourier transformation ($FFT^{-1}$). The result of this real-time operation is the actual dynamic load line of the DUT at its terminals.

20 Claims, 23 Drawing Sheets

Voltage and current probe embodiment in a Slabline for strong electric field coupling.

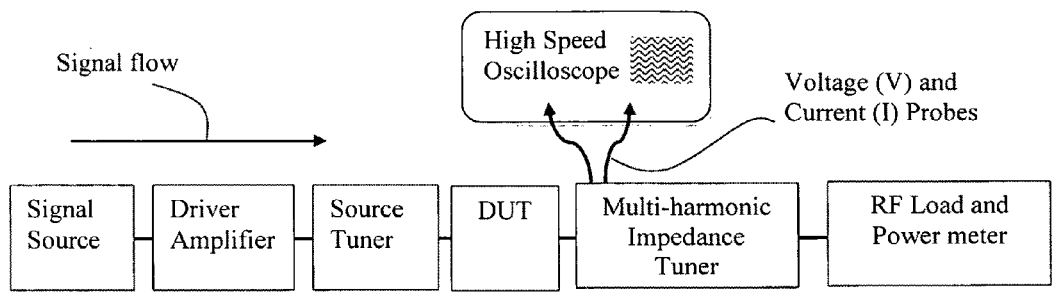
FIGURE 1: Load pull test setup for measuring power contours and real time voltage and current of a DUT, using I-V probes.

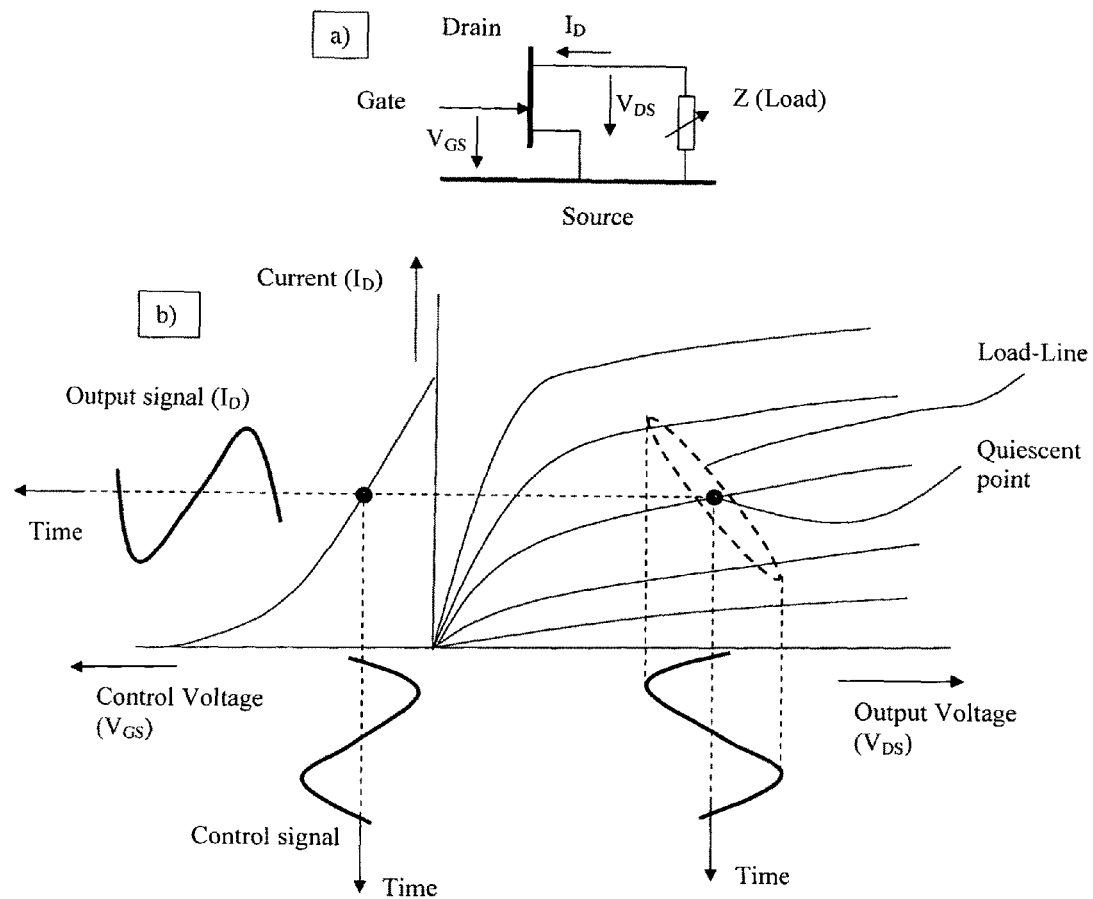
FIGURE 2: Prior art, (a) Voltage-Current definitions and (b) I-V curves and Load-Line of a typical filed-effect transistor (FET) in quasi linear operation (Class A).

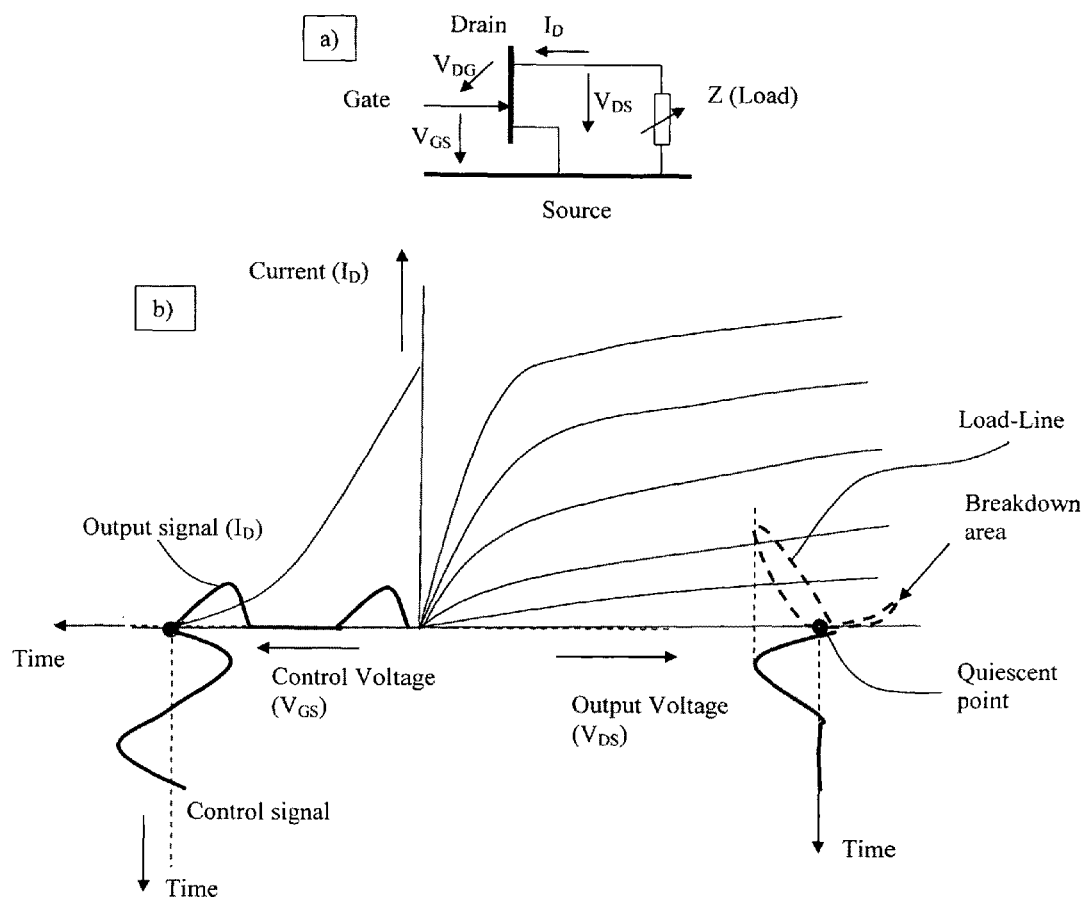
FIGURE 3: Prior art, (a) Voltage-Current definitions and (b) I-V curves and Load-Line of a typical filed-effect transistor (FET) in strongly nonlinear operation (Class C-F...).

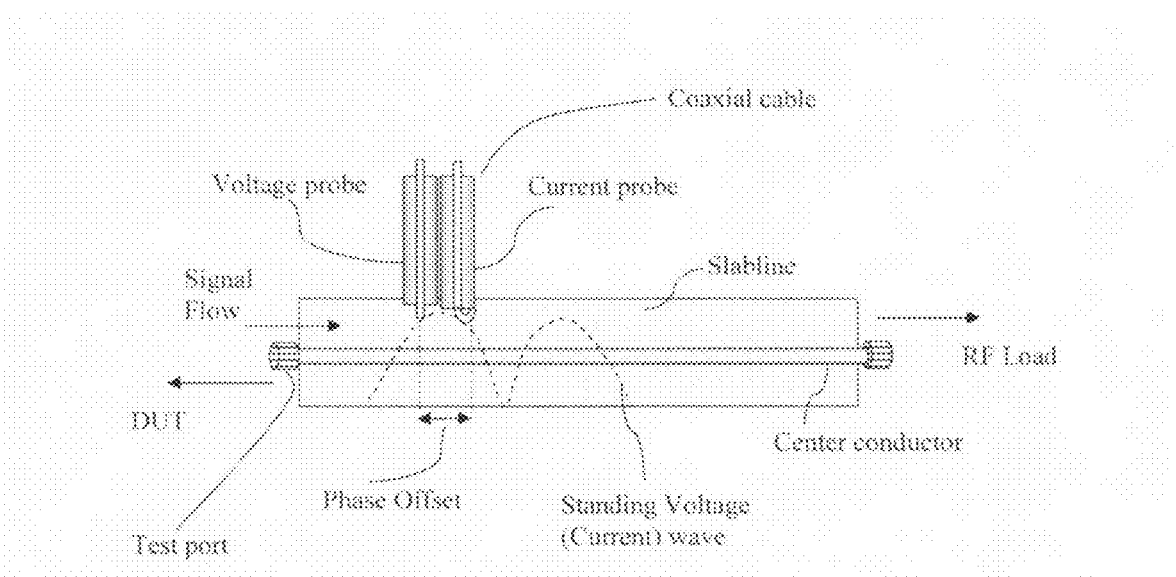
FIGURE 4: Prior art, Voltage – Current Probe inside a Slabline; the Slabline can be part of an impedance tuner

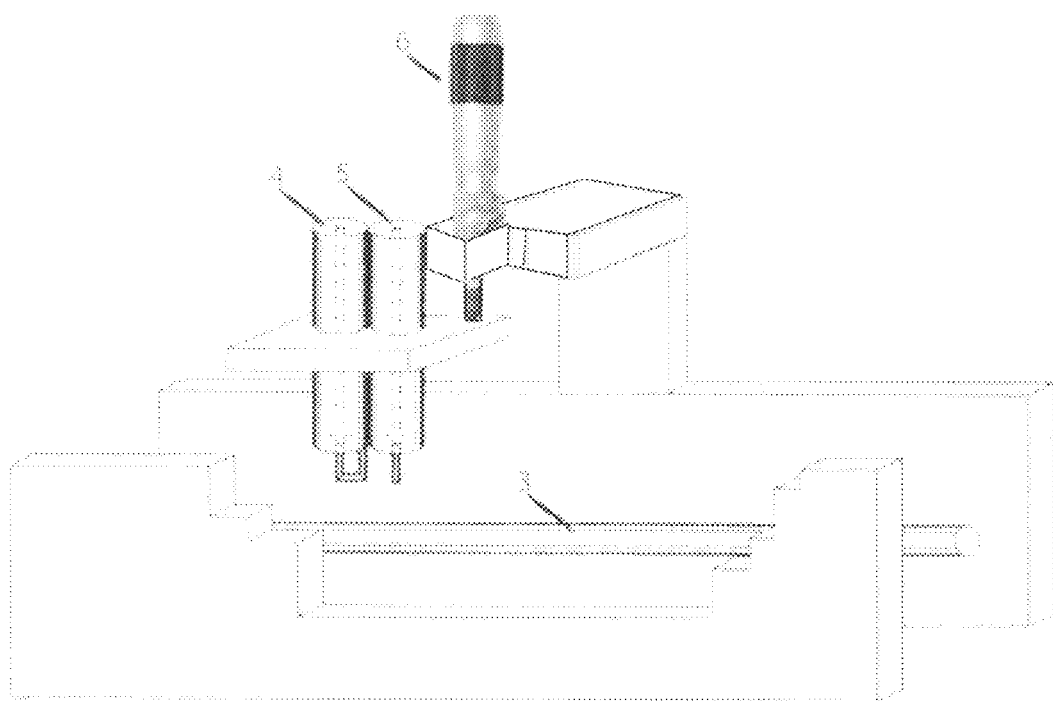
FIGURE 5: Prior art, [1], adjustable I-V probe in a Slabline

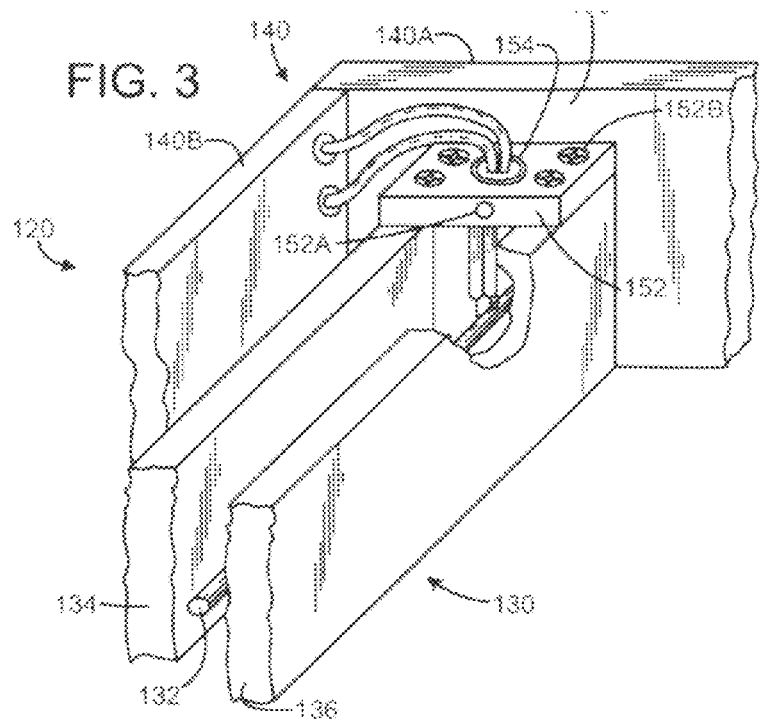
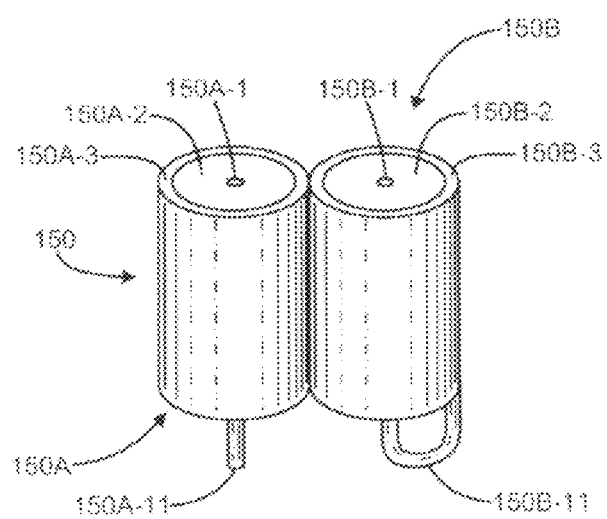
FIGURE 6: Prior art, [2], I-V probe and embodiment in a Slabline FIGURE 7: Prior art, [2], I-V probes and embodiment in a Slabline structure.

FIGURE 8: Prior art, [2], I-V probe and embodiment in a micro-strip structure.

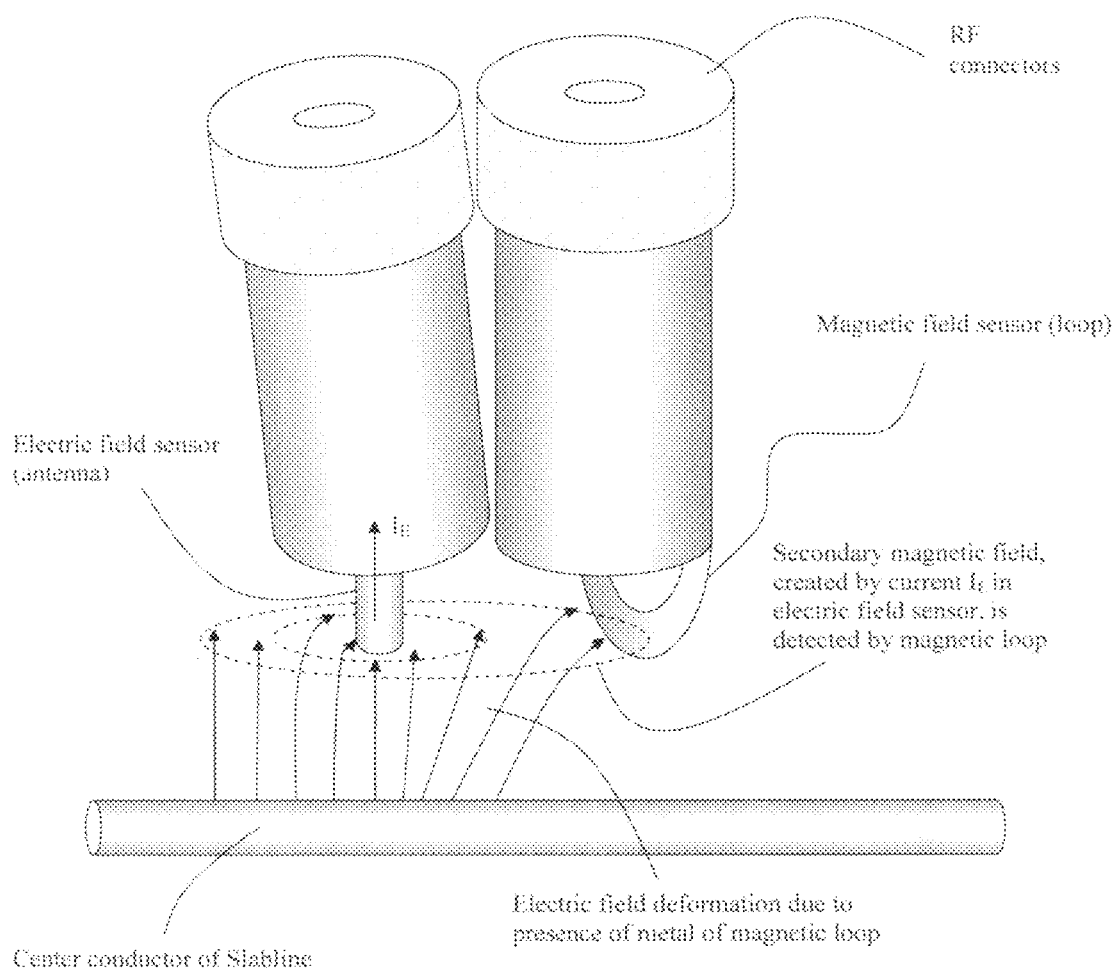
FIGURE 9: Mutual coupling between adjacent I-V probes

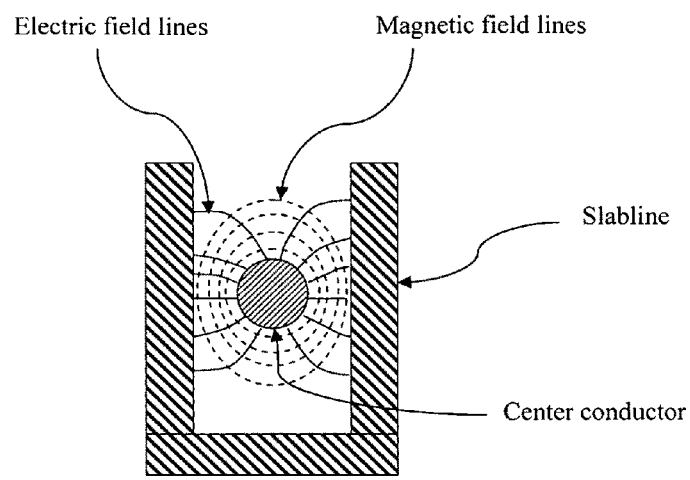
FIGURE 10: Prior art, Electric and magnetic field distribution in a Slabline. Electric field lines are perpendicular to Slabline walls and central conductor as well as to magnetic field lines.

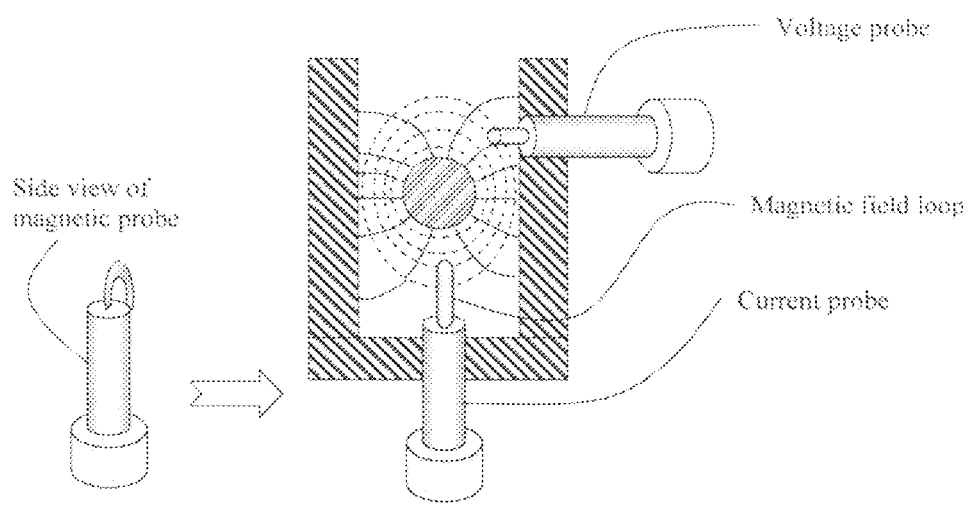
FIGURE 11: Voltage and current probe embodiment in a Slabline for weak electric field coupling.

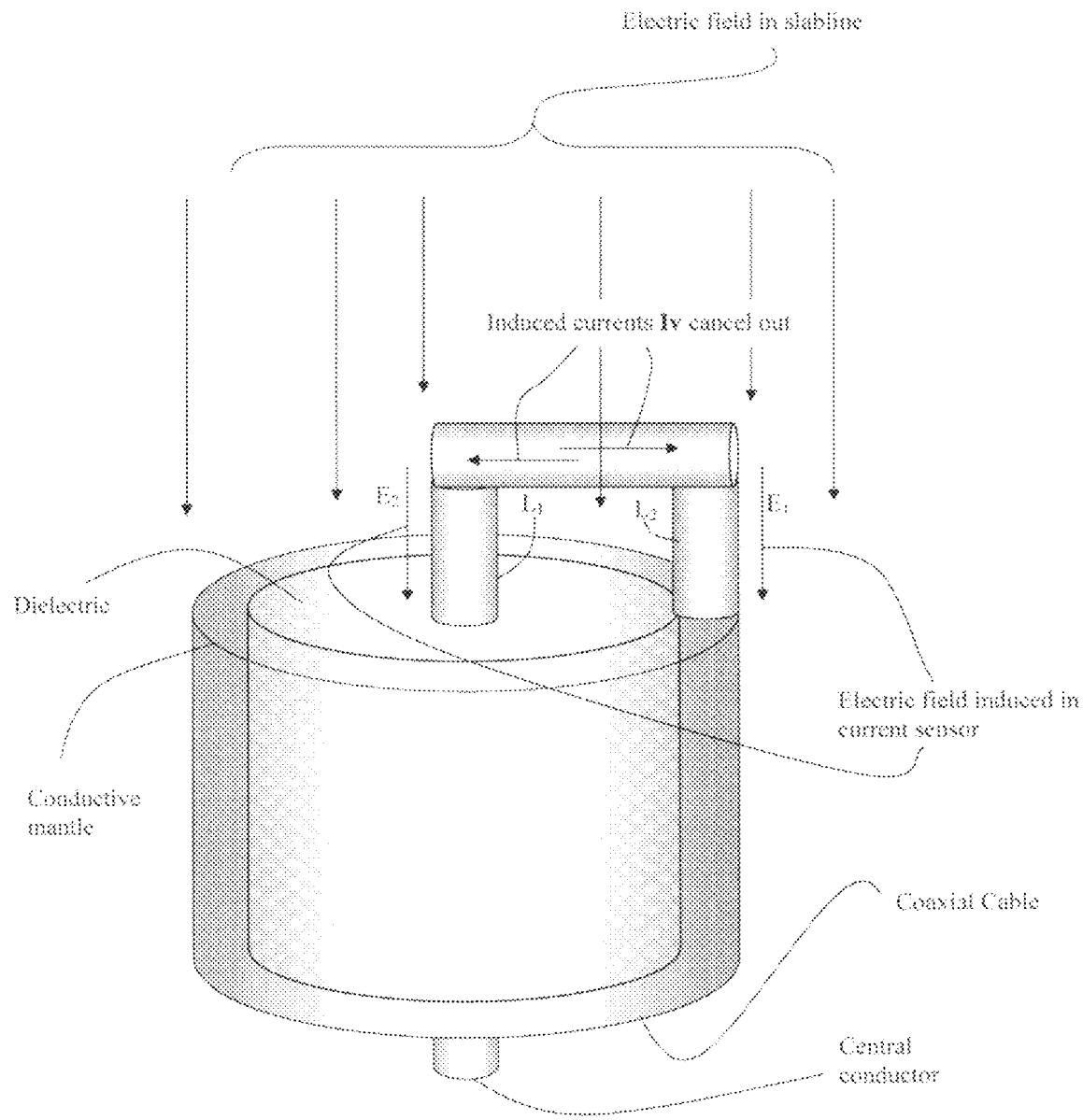
FIGURE 12: Ideal form of current sensor having identical vertical legs L1 and L2.

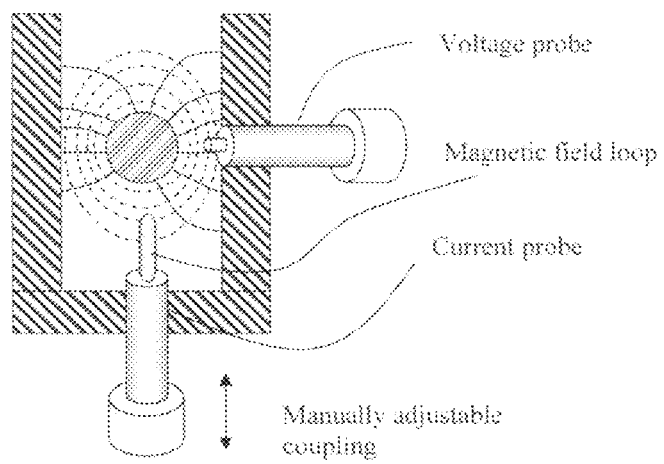
FIGURE 13: Voltage and current probe embodiment in a Slabline for strong electric field coupling.

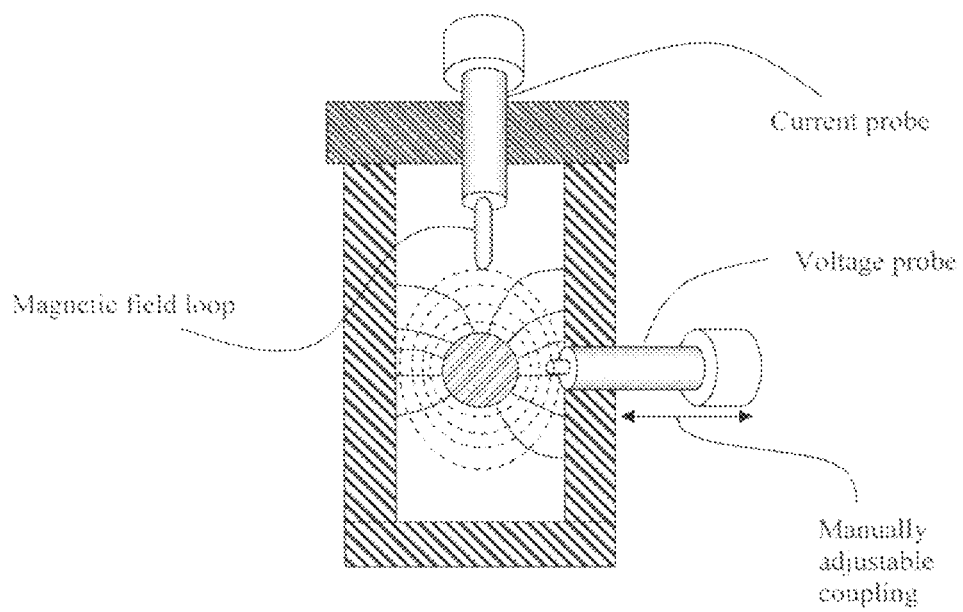
FIGURE 14: Voltage and current probe embodiment in a Slabline for strong electric field coupling, placed at the top.

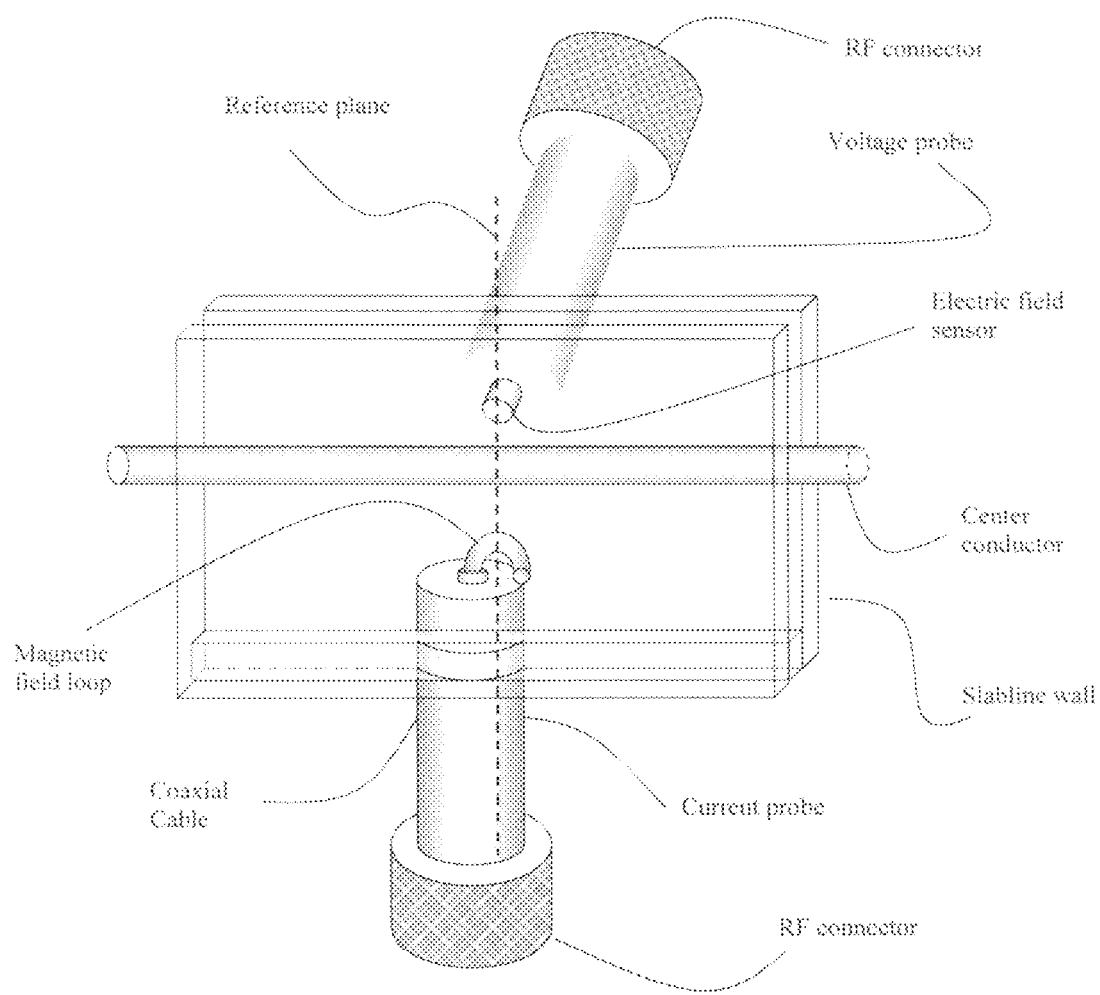
FIGURE 15: Perspective view of Voltage and Current probe in a Slabline, placed at the same reference plane, or the same distance from the DUT.

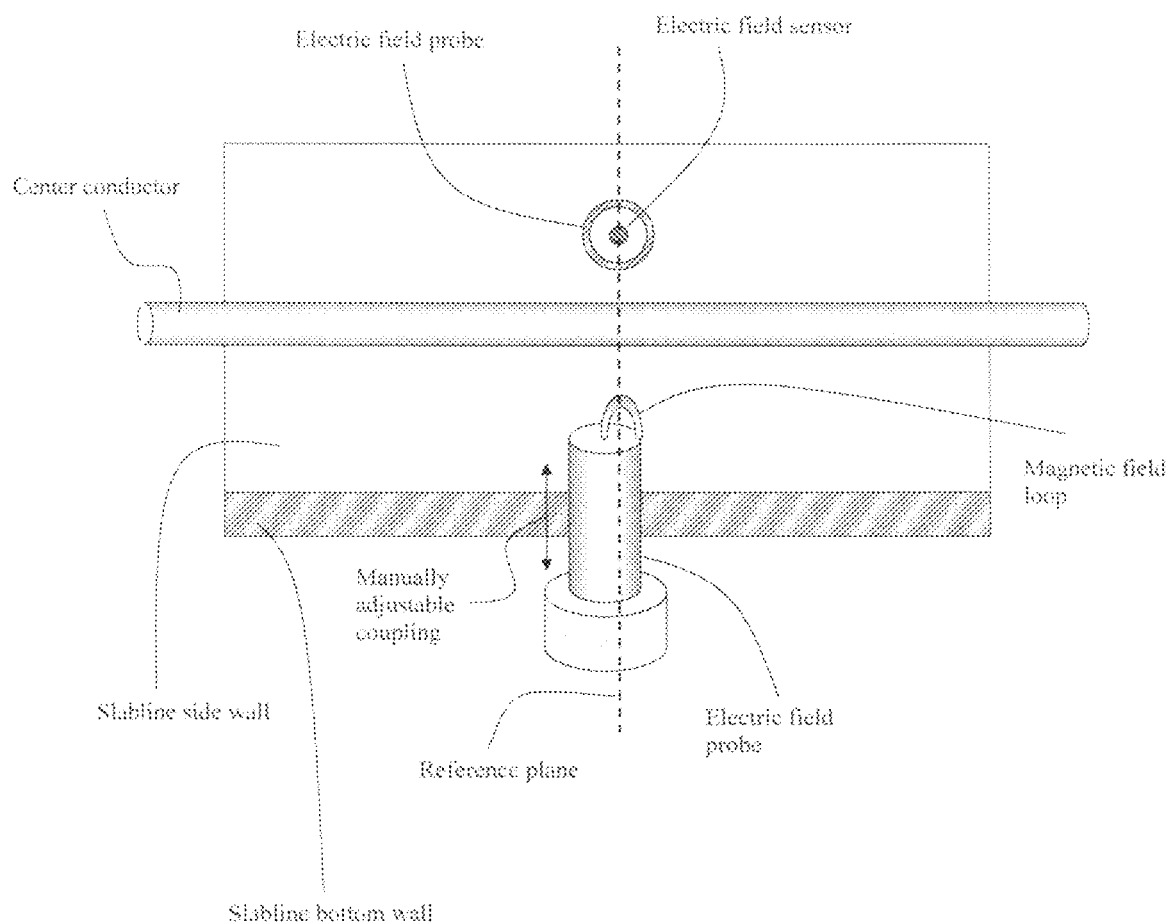
FIGURE 16: Side view and cross section of I-V probe embodiment

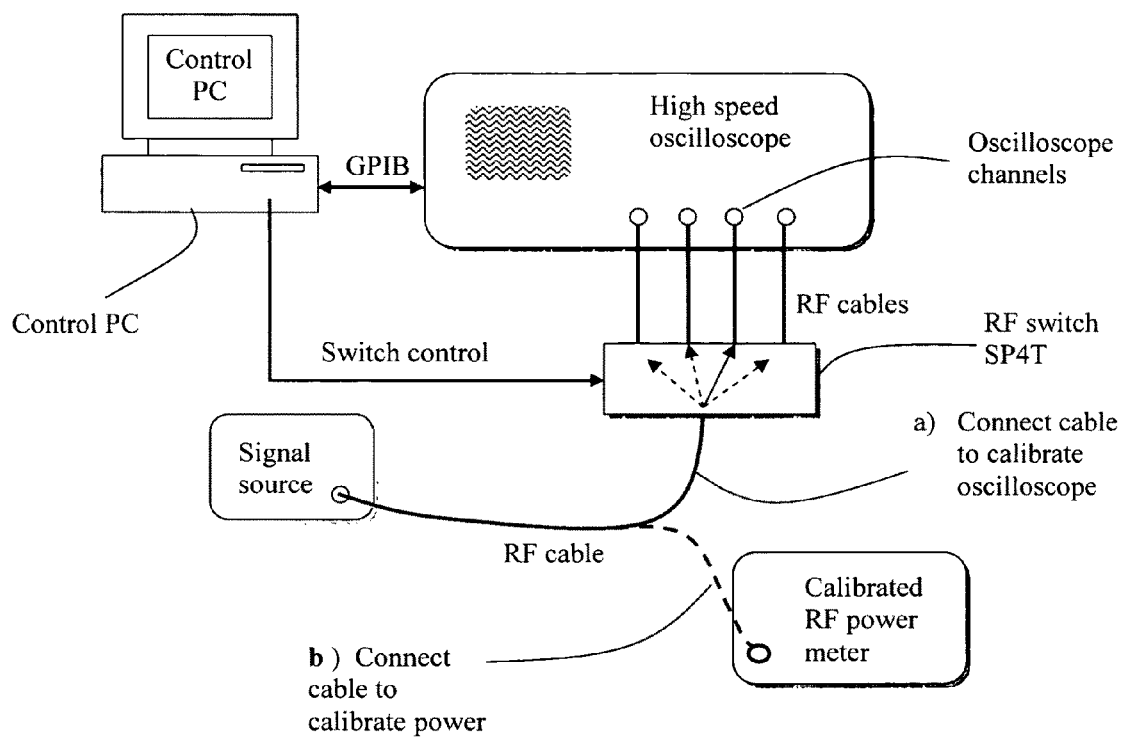
FIGURE 17: Calibration of Oscilloscope

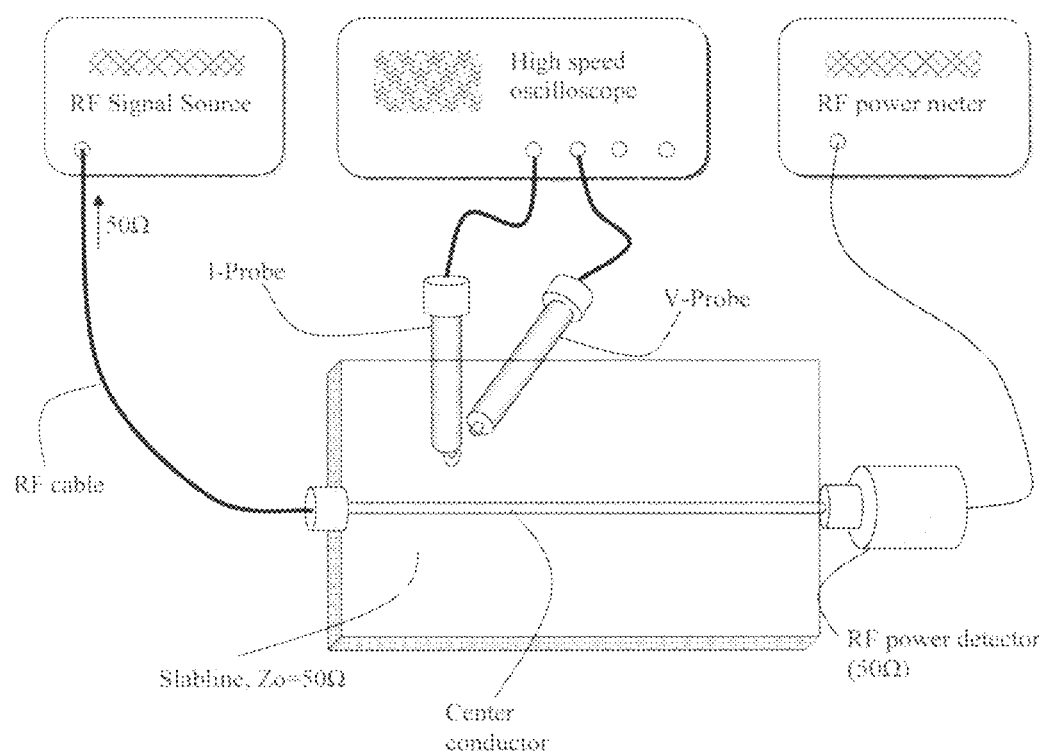
FIGURE 18: Calibrating Voltage and Current on the Oscilloscope

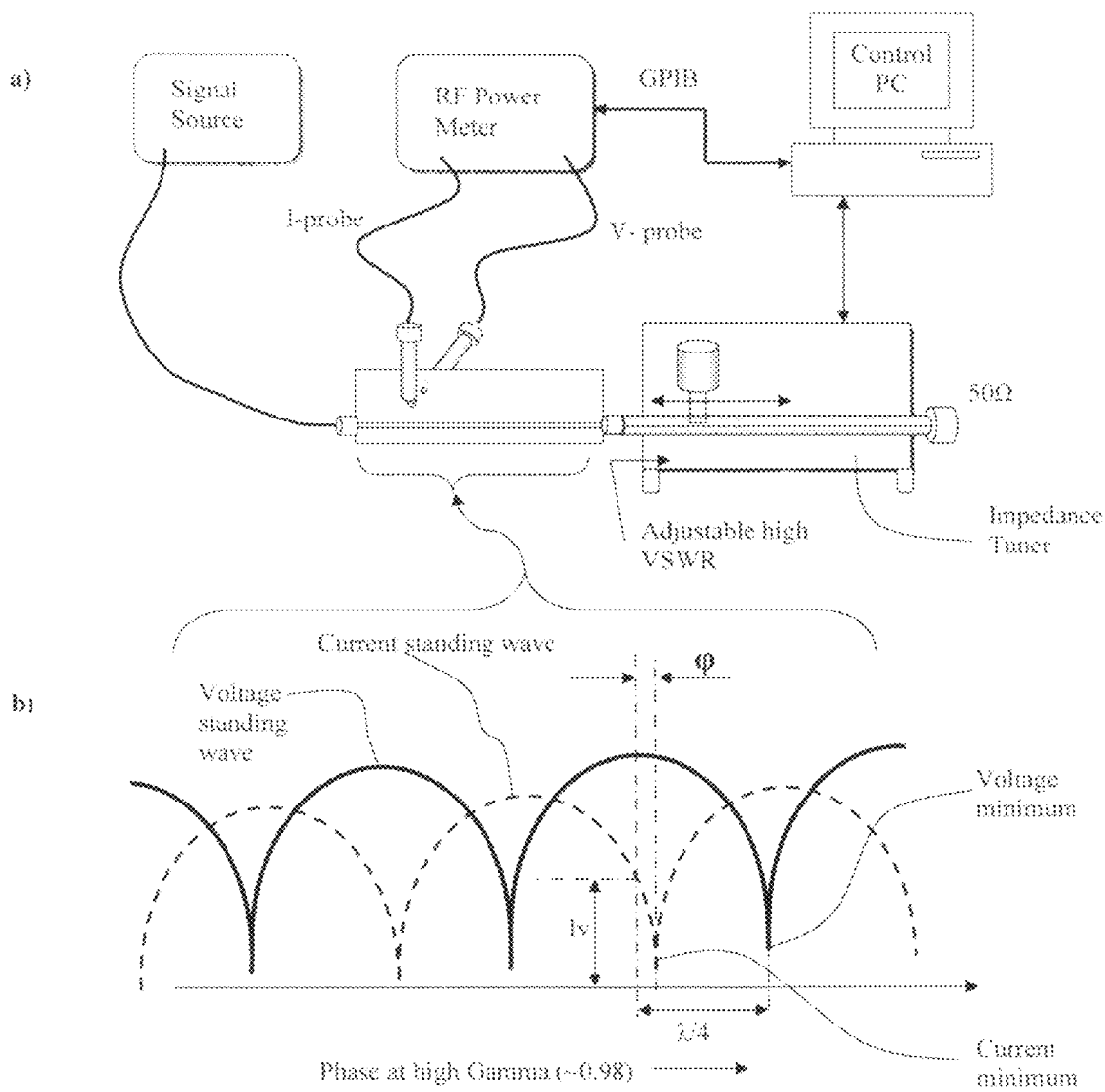
FIGURE 19: Error calibration of IV sensor module using an automatic high reflection tuner.

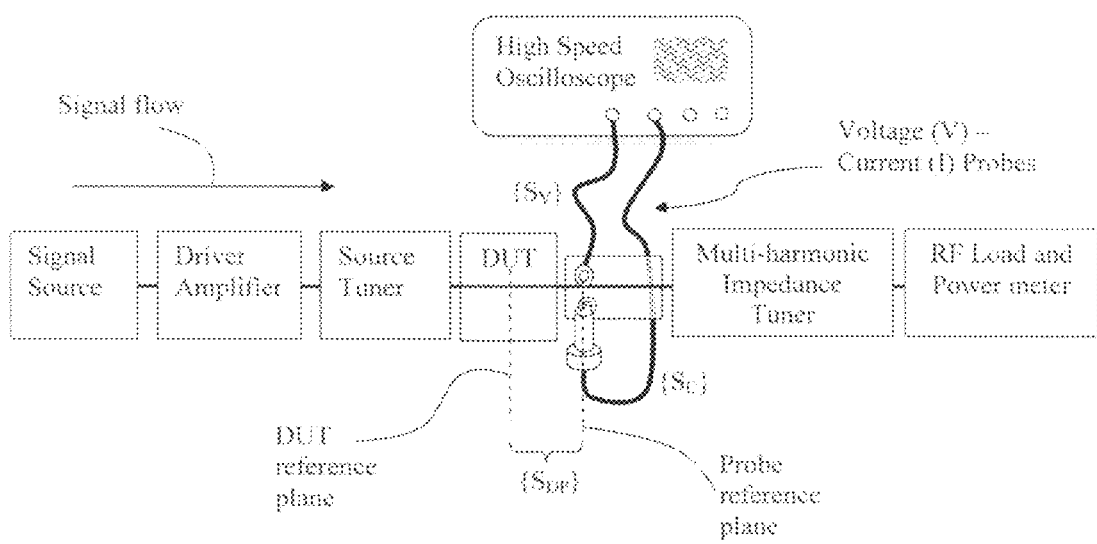
FIGURE 20: Setup for measuring Load Pull and Load-lines at the output of the DUT

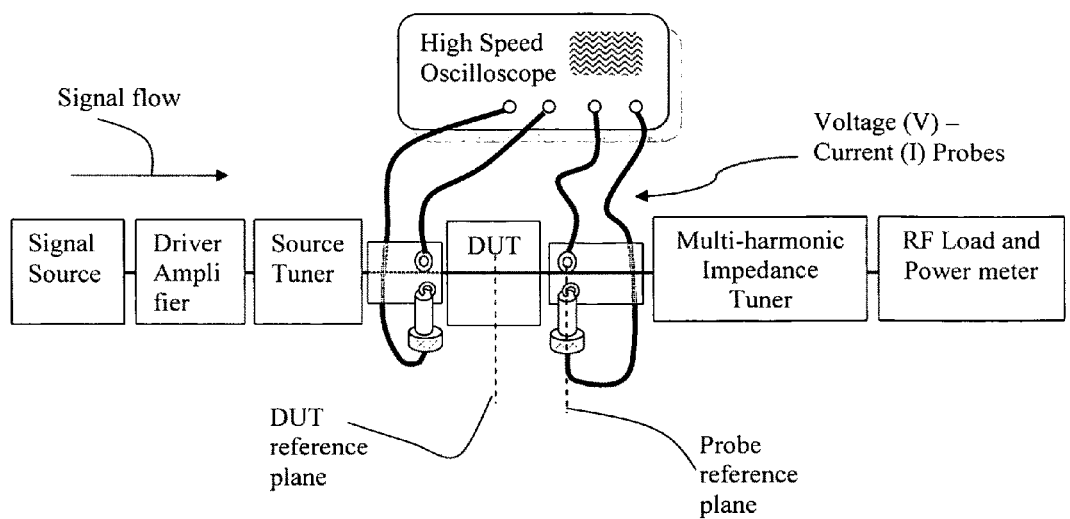
FIGURE 21: Setup for measuring Load Pull and Load-lines at the input and the output of the DUT

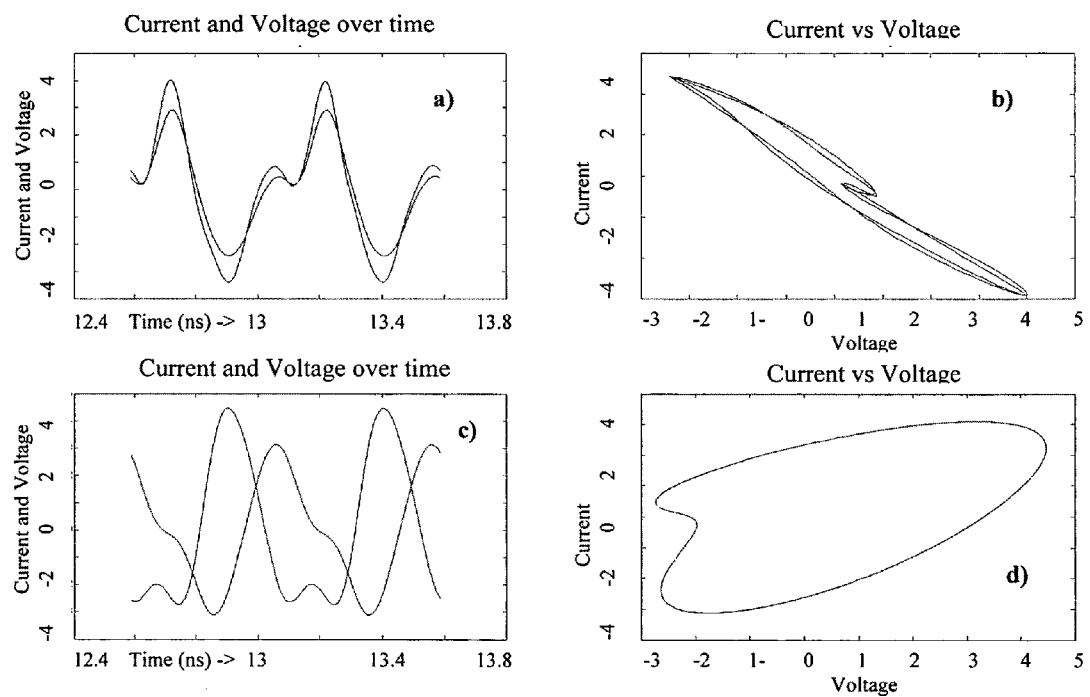
FIGURE 22: Measured Voltage and Current as a function of time: a) at I-V probe reference plane, c) at DUT reference plane; Load-line: b) at probe reference plane, d) at DUT reference plane.

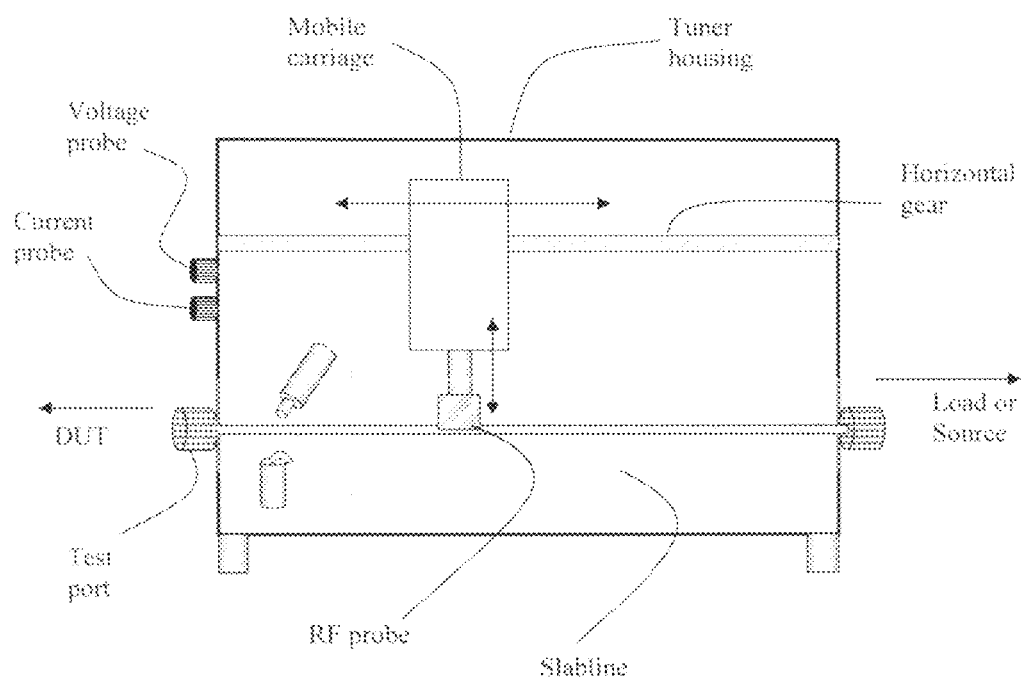
FIGURE 23: Impedance tuner with electric-magnetic field sensors integrated inside the tuner housing.

WIDEBAND I-V PROBE AND METHOD

PRIORITY CLAIM

61/202,007

CROSS-REFERENCE TO RELATED ARTICLES

[1] U.S. Pat. No. 7,282,926, Verspecht et al.
[2] US Patent application 2006/0279275, Gary Simpson
[3] US Provisional application, "A dual directional coupler with adjustable coupling factor", J. Verspecht, C. Tsironis, J. P. Teyssier, F. DeGroote
[4] "Large Signal Network Analyzer uses . . . ", J. P. Teyssier, F. DeGroote, Proceedings of the ARFTG 2005.
[5] Wikipedia, <<Lissajous Curves>>
[6] Wikipedia, <<Fast Fourier Transformation>>
[7] Datasheet, Oscilloscope Agilent, Infiniium, Series 8000
[8] Datasheet, Oscilloscope Tektronix, DSA8200
[9] TRL Calibration, Agilent Literature
[10] "Computer Controlled Microwave Tuner", Product Note 41, Focus Microwaves, January 1998.
[11] U.S. Pat. No. 7,135,941; "Triple Probe Automatic Slide Screw Tuner . . . ", C. Tsironis

STATEMENT REGARDING FEDERALLY SPONSORED RESEARCH OR DEVELOPEMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of microwave power transistors using automatic microwave tuners in order to synthesize reflection factors (or impedances) at the input and output of said transistors and analyze their large signal load-line behavior.

A popular method for testing and characterizing microwave transistors at high power nonlinear operation is "load pull" and "source pull" [10]. Load pull or source pull are measurement techniques employing microwave tuners and other microwave test equipment. The microwave tuners in particular are used in order to manipulate the microwave impedance conditions under which the Device under Test (DUT, or transistor) is tested (FIG. 1).

Whereas load and source pull provide information about the RF impedance presented to the DUT at the fundamental (Fo) and harmonic (2Fo, 3Fo, 4Fo, . . . ) frequencies, it does not yield any information about the actual voltage and current trajectory in real time. As long as the voltage and current peaks around the quiescent operating bias do not exceed breakdown values, the transistor operation is considered safe. (FIG. 2) This kind of operation is typically called "class A" or "class A-B", or "class B". However, in many cases the transistors are biased such as to allow current flow only when the signal exceeds a certain value. This is a "burst" kind of operation and allows a drastic increase in power added efficiency, since the current and power consumption is zero in the absence of an input signal (FIG. 3). Such operation conditions are usually called "class C", "class F", etc . . . ).

In a case like this the overall voltage excitation applied to the transistor between the control port (Gate) and the output port (Drain) can reach and exceed values into the avalanche breakdown range: $V_{DG}=V_{DS}+|V_{GS}|$, (FIG. 3). In this case some transient avalanche current is going to flow at each peak voltage and the transistor will degrade rapidly towards material migration and electrical failure.

Further on the voltage-current trajectory, typically called the "load-line", will depend on the complex impedance presented to the transistor (FIGS. 1-3). It is therefore important to investigate and associate said load-line not only to the signal amplitude applied to the DUT, but also to the complex RF load. Since the DUT is operating under strong nonlinear conditions and the input signal is distorted, there are harmonic components created, which need to be terminated with the corresponding harmonic loads. A setup that allows this test is a "harmonic load pull setup" as shown in FIGS. 1, 21.

DESCRIPTION OF PRIOR ART

The voltage and current flowing through a transistor (DUT) can be measured using voltage and current (I-V) probes and a real time or sampling high speed oscilloscope [7, 8]. At microwave frequencies such probes are made using electric field sensors (antennas) and magnetic field loops (FIG. 4). The electric field sensor measures the voltage and the magnetic loop the current flowing in the transmission line at the fundamental frequency (Fo) and the harmonics (2Fo, 3Fo, 4Fo, . . . ). The configuration of FIG. 4 is prior art. FIGS. 5, 6, 7, 8 are also from prior art [1, 2].

As can be seen from FIGS. 5, 6, the electric field sensor and the magnetic field loop are placed next to each-other, in direction of the signal propagation inside the transmission line. This creates an undesired phase offset between the detected voltage and current and limits the frequency bandwidth, when the distance between the two probes reaches $\sim 1/10$ wavelength, in which case the probe assembly cannot be considered as "lumped" element any more.

In addition this "next to each other" configuration (FIGS. 5, 6, 8) creates a mutual influence between the electric and the magnetic sensors as follows (FIG. 9): The electric current flowing through the electric sensor, induced by the electric field in the slabline, creates around said electric sensor a secondary magnetic field, which is also detected by the magnetic loop placed in close proximity. This falsifies the current reading of the magnetic sensor. On the other hand, the physical proximity of the metallic conductor of the magnetic loop to the electric sensor, will deform the electric field lines, which will turn towards the closest metallic surface (FIG. 9) and thus result in false voltage readings of the electric field sensor. Both these phenomena are falsifying the measurement, but are inherent to the prior art sensor assembly configuration (FIGS. 5, 6, 8).

In conclusion, previously described field detection probes (FIGS. 5, 6, 8) share common disadvantages: they are configured along the propagation axis of the signal and thus do not detect the voltage and currents at the same position, thus limiting the bandwidth (FIG. 4). The second short-coming of prior described probes is the proximity of the metallic conductors which do influence each-other mutually (FIG. 9). This phenomenon limits the sensitivity of the probes and leads to false data.

FIG. 7 shows electric and magnetic probes positioned at opposite sides of the center conductor of a slabline; even if this configuration avoids both said disadvantages (cross coupling and phase offset), it is not optimum, since the electric field is extremely weak above and below the center conductor and is strongest towards the side walls of said slabline (FIG. 10); and, because the electric field above and below the center conductor is very weak, the electric field sensor needs to be placed closer to said center conductor with a distorting effect on the magnetic field in its surroundings.

No previous invention describes an orthogonal configuration as used in the present apparatus (FIG. 11).

Load lines of microwave transistors have been reported before [4]. They are measured using either voltage-current probes or low loss directional couplers and Large Signal Network Analyzers (LSNA). The LSNA method allows also measuring scattering parameters (s-parameters) at harmonic frequencies and uses them to develop large signal models. A very compact and low loss coupler structure has been used to detect the traveling waves on a slabline [1]. However this configuration requires a complete vector calibration and an additional phase standard for all harmonic frequencies and a (preferably) four-port network analyzer, in order to yield the load-lines [4].

In our case the I-V sensor assembly allows direct reading of the voltage and current on the slabline and fast Fourier transformation (FFT) [6] allows converting from the time domain to the frequency domain and back as a known technique is used in this invention as well. The load-lines are, in fact, the known from literature Lissajous curves [5].

BRIEF DESCRIPTION OF THE SEVERAL VIEWS OF THE DRAWINGS

The invention and its mode of operation will be more clearly understood from the following detailed description when read with the appended drawings in which:

FIG. 1 depicts a Load pull test setup for measuring power contours and real time voltage and current of a DUT, using I-V probes.

FIG. 2 depicts prior art, (a) Voltage-Current definitions and (b) I-V curves and Load-Line of a typical filed-effect transistor (FET) in quasi linear operation ("Class A").

FIG. 3 depicts prior art, (a) Voltage-Current definitions and (b) I-V curves and Load-Line of a typical filed-effect transistor (FET) in strongly nonlinear operation ("Class C", "Class-F").

FIG. 5 depicts prior art [1], adjustable I-V probe in a Slabline.

FIG. 7 depicts prior art, [2], I-V probes and embodiment in a Slabline structure.

FIG. 8 depicts prior art [2], I-V probe and embodiment in a micro-strip structure.

FIG. 10 depicts prior art, Electric and magnetic field distribution in a Slabline. Electric field lines are perpendicular to Slabline walls and center conductor as well as to magnetic field lines.

FIG. 11 depicts voltage and current probe embodiment in a Slabline for weak electric field coupling.

FIG. 12: Ideal form of current sensor having identical vertical legs L1 and L2.

FIG. 13 depicts voltage and current probe embodiment in a Slabline for strong electric field coupling.

FIG. 14 depicts voltage and current probe embodiment in a Slabline for strong electric field coupling, placed at the top.

FIG. 15 depicts voltage and current probes in a Slabline, placed at the same reference plane, or the same distance from the DUT.

FIG. 16 depicts a side view and cross section of I-V probe embodiment.

FIG. 17 depicts the calibration of Oscilloscope.

FIG. 18 depicts a three port calibration setup for the I-V probe module.

FIG. 19: Error calibration of IV sensor module using an automatic high reflection tuner.

FIG. 20 depicts a setup for measuring Load Pull and Load-lines at the output of the DUT.

FIG. 21 depicts a setup for measuring Load Pull and Load-lines at the input and the output of the DUT.

FIG. 22 depicts measured Voltage and Current as a function of time; a) at I-V probe reference plane, c) at DUT reference plane; Load-line at b) probe reference plane, d) DUT reference plane.

FIG. 23 depicts Impedance tuner with electric-magnetic field sensors integrated inside the tuner housing.

DETAILED DESCRIPTION OF THE INVENTION

The electric-magnetic field sensor assembly described here avoids the shortcomings of existing solutions; the fact that said sensor assembly is mounted inside a low loss slabline (FIG. 11) allows an orthogonal configuration, in which the electric field sensor is close to the strongest area of the electric field and the magnetic field sensor is shielded by the center conductor and detects the magnetic field either at the bottom or at the top of said slabline, in which area the electric field is weakest and least disturbed.

Even though there will be a small electric field deformation due to the presence of said magnetic field loop at the bottom of said slabline, the electric field in this area is quasi zero, because in the slabline structure the electric field is concentrated towards the sidewalls (FIG. 10). The magnetic to electric field influence is therefore the smallest possible.

The electric current, induced into the electric field sensor creates a surrounding magnetic field; however this field, in addition to being very small, when it reaches the bottom of said slabline, it is also tangential to said magnetic loop at the bottom of said slabline and cannot be detected by said magnetic loop (FIG. 11). The electric to magnetic field influence is therefore also minimized.

In consequence the orthogonal mounting configuration of said electric-magnetic field sensors is, in the case of a slabline, the optimum configuration regarding cross-coupling between electric and magnetic fields (FIG. 11). This orthogonal configuration also allows placing said sensors at the same cross section of said slabline, thus eliminating any distance between said sensors in the direction of the signal flow (FIG. 15). This allows detecting the electric and magnetic fields at the same phase and maximizing the frequency response bandwidth of the sensor assembly.

Figure 9B:
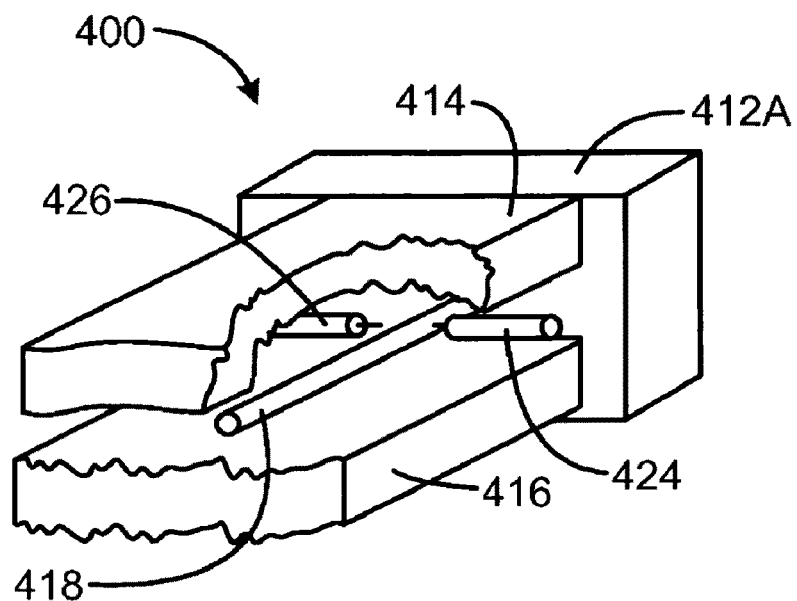
FIG. 9 depicts mutual coupling between adjacent I-V probes.
Figure 4B:
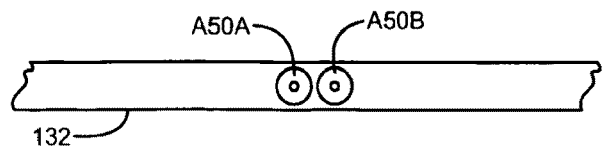
FIG. 4 depicts prior art, Voltage-Current Probe inside a Slabline: the Slabline can be part of an impedance tuner.
Figure 4C:
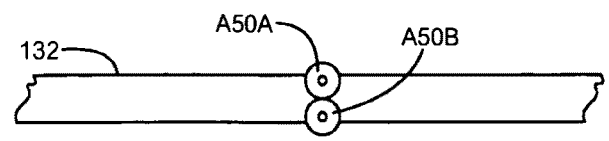
Figure 6:
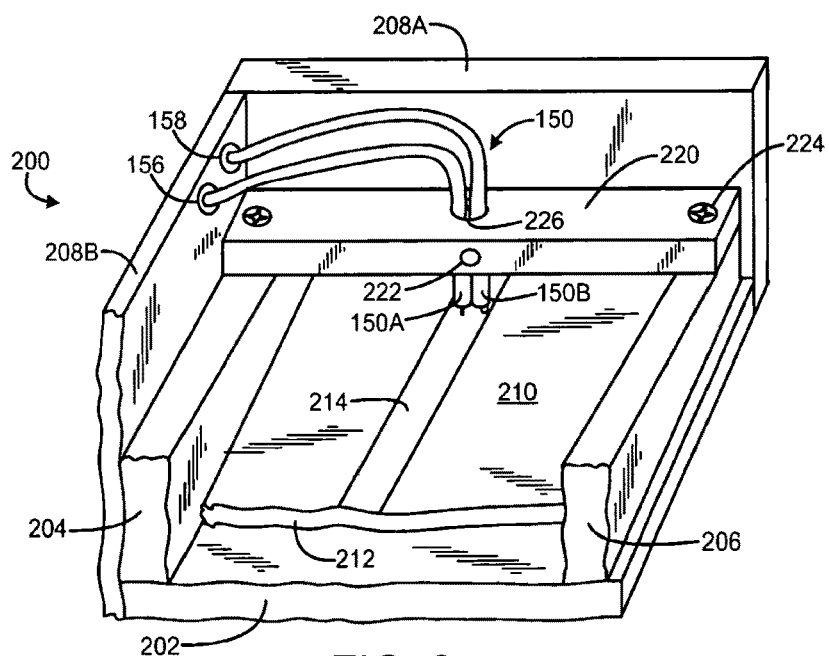
FIG. 6 depicts prior art [2], I-V probe and embodiment in a Slabline.

The electric field sensor (FIG. 9) cannot detect magnetic field energy, since it does not comprise a closed conductive loop. However, the magnetic field sensor at the bottom or at the top of said slabline (FIG. 12) may detect the electric field present in this area, which will induce a residual Iv current in the loop, if the two induced electric field vectors E1 and E2 are big enough and not identical; if said electric field vectors E1 and E2 are identical and opposite they will cancel each-other (FIG. 12) and the residual current Iv will be zero. In order to optimize the detecting behavior of said magnetic field sensor, in the sense that it will detect a minimum electric field, both vertical legs of the sensor loop have to be manufactured as small as possible, identical in length and parallel to the central conductor of the coaxial cable. If said legs are identical, any detected electric field will have opposite sign and cancel each-other (FIG. 12).

By inserting or withdrawing said sensors from the slabline the coupling can be manually adjusted easily. It can be brought to best fit the frequency range of interest and the level of signals used (FIGS. 13, 14).

The sensor assembly needs to be calibrated, together with the oscilloscope, in order to enable accurate reading and transformation to the DUT reference plane. This can be done by connecting a known RF signal at the fundamental and the harmonic frequencies to the input of each channel of the oscilloscope [7, 8] and retrieve the response via instrument communication (GPIB, USB or TCP/IP) into the control computer, which will compare the data and compute correcting factors, or calibration factors, for the signal's amplitude and relative phase, for each harmonic frequency. This can be done easily using a sweep signal source and a remotely controlled RF switch, of the type SP4T, which connects a common input port to four output ports (FIG. 17, configuration A)). The RF transmission of the switch must be calibrated, for each position, ahead of time and the data must be included in the overall calibration, as is known in prior art. After such calibration the data retrieved by the computer from each channel of the oscilloscope will be corrected in amplitude and phase to the input port of each sensor.

A further calibration step is required between the output port of said sensors and the DUT reference plane (FIGS. 18, 19). The absolute value of the oscilloscope voltage reading needs to be calibrated. This is a simple procedure, in which the said source signal is connected with a calibrated RF power meter and the absolute power reading is registered at each harmonic frequency (FIG. 17, configuration B)). Since both, the oscilloscope input ports and the signal source output port have an internal impedance of 50Ω, the voltage reading can be calibrated using the simple relation: $V_O = \sqrt{2 \ast 50\Omega \ast P}$; where P is the measured power (in Watts) at the calibrated power meter, and $V_O$ should be the voltage reading at the oscilloscope (in Volts). If the actual oscilloscope reading is different than $V_O$, then a correction must be applied, as part of the calibration procedure.

Despite the fact that the voltage and current probes are mounted orthogonally and the current probe is placed in an area of minimum electric field, there will always be some leak of electric field into the current probe. This error may be corrected by means of an additional calibration step (FIG. 19). In this setup a high reflection impedance tuner creates an adjustable high VSWR and standing voltage and current waves on the slabline, which are 90° out of phase. The error appears in form of a vector $Iv=|Iv|\exp(j\phi)$ which is superimposed on the actual current vector I. Both can be measured using the setup of FIG. 19 a); when the standing wave created by the tuner corresponds to a maximum voltage at the voltage sensor level, then the actual current should be I=0, but it is not, due to the error vector Iv. Therefore the reading at the current probe corresponds to $|Iv|$; normally the reading should be Iv=0, but it is not, because of the leakage. The phase of said Iv vector can be determined when we shift the standing wave using said tuner such as to reach a current reading minimum. In this case the actual current reading will be anti-phase with the leakage vector Iv. The phase shift needed to reach this point is the phase of the leakage vector. The leakage error vector Iv needs to be added to the current reading of the oscilloscope by the control computer.

FIGS. 20 and 21 show typical load pull setup and the associated current and voltage probes, connected to the oscilloscope. In the setup of FIG. 20 only two channels are used, for measuring the output voltage and current. The setup can be extended to measure the input voltage and current using probes inserted symmetrically to the DUT reference plane, between the DUT and the input tuner (FIG. 21). The probes themselves can be integrated in the tuner slabline or be external modules. In any case the voltage-current probes must be inserted between the DUT and the first probe of said tuner; the first probe of said tuner is the closest one to the test port of said tuner.

Wideband slide screw impedance tuners can be used for manipulating the RF impedance at the fundamental frequency (Fo) [10]; multi-probe impedance tuners [11] can be used, preferably at the output of the DUT, in order to manipulate the RF load impedance at the fundamental (Fo) and harmonic (2Fo, 3Fo, ...) frequencies. Such a setup reveals the effect of harmonic tuning on the trajectory of the load-line of the DUT under strong nonlinear operation ("Class C" and higher). In some cases multi-harmonic tuners can also be used at the input of the DUT.

Once calibrations are terminated the time domain voltage and current data retrieved from the oscilloscope must be converted to the frequency domain using Fast Fourier Transformation (FFT) [6]. The obtained harmonic frequency components are multiplied by the transfer coefficients between the oscilloscope ports and the DUT reference plane, including the correction factors determined during the channel calibration. Finally the obtained frequency components are processed by inverse Fast Fourier Transformation ($FFT^{-1}$) into a corrected time domain trace. Plotting the outcome of the magnetic field sensor (current) versus the outcome of the electric field sensor (voltage) results in the dynamic load-line of the DUT at its reference plane [5].

FIG. 20 shows a load pull setup with load-line measurements capability and the associated calibration path references. $\{S_V\}$ is the transmission factor between the oscilloscope and voltage probe, $\{S_C\}$ is the transmission factor between oscilloscope and current probe, $\{S_{DP}\}$ is the transmission factor between the DUT output port and the RF connectors of said voltage and current probes. The same calibration steps must be doubled in case an input side sensor assembly is used (FIG. 21). The whole setup is automated via a system computer, which controls the tuners and reads the power meter and the oscilloscope. The load pull measurement technique is known from prior art and not shown here [10].

FIG. 22 shows measured load-line results on a saturated amplifier at a fundamental frequency Fo=2 GHz. The top two plots show voltage-current and load-line at the oscilloscope reference plane and the lower two plots show the same results at the DUT (amplifier output) reference plane. The distorted signal form in FIG. 22 a) shows that the signal from the amplifier measured at the oscilloscope ports includes several harmonic components, which have been identified by the FFT transformation and de-embedded back into the amplifier output port (FIG. 20 c)).

FIG. 23 shows the preferred embodiment of a voltage-current sensor assembly inside an impedance tuner. Said tuner may be a single probe wideband tuner or a multi-probe harmonic tuner.

The present invention has been described in a preferred embodiment and shall not be limited by alternative configurations, such as the use of alternative measuring instruments or alterations of said calibration procedures.

What we claim as our invention is:

1. An electro-magnetic signal sampling assembly comprising an electric field sensor and a magnetic field sensor, said sensors being incorporated in a low loss parallel plate airline (slabline); said slabline comprises an input (test) port and an output (idle) port and a center conductor connecting both ports; said electric field sensor being made as an extension (probe) of the center conductor of a coaxial cable and said magnetic field sensor being a grounded loop made using the extension of the center conductor of a coaxial cable; said electric and magnetic sensors being mounted orthogonally to each other and to the center conductor of said slabline and at the same electrical distance from the test port of said slabline, said electric field probe being inserted in the sidewall of said slabline at the approximate height of the center conductor and said magnetic field sensor being inserted perpendicularly either through the bottom or top plate of said slabline.

2. An electro-magnetic signal sampling assembly as in claim 1, wherein the protrusion of the probe of said electric sensor inside said slabline can be varied to adjust the strength of the electric coupling.

3. An electro-magnetic signal sampling assembly as in claim 1, wherein the distance of said magnetic sensor from the center conductor of said slabline can be varied to adjust the magnetic coupling.

4. An electro-magnetic signal sampling assembly as in claim 1, wherein said magnetic field sensor is built from the extended center conductor of the coaxial cable; said extension is forming a conductive closed loop of which one end is attached to the conductive mantle (ground plane) of said coaxial cable; the plane of said conductive loop being parallel to the center conductor of said slabline.

5. An electro-magnetic signal sampling assembly as in claim 1, wherein said test port of said slabline being connected to a device under test (DUT).

6. An electro-magnetic signal sampling assembly as in claim 5, comprising an electro-mechanical impedance tuner including a signal sampling section and a tuning section; said sampling section comprising the electric field sensor and the magnetic field sensor, and said tuning section comprising the test port and the idle port, said ports being connected by said slabline; and one or more metallic capacitive probes vertically insertable in a slot of said slabline, the distance of said sensors from the center conductor of said slabline and from the test port being remotely controllable by stepper motors and appropriate gear; said signal sampling section being inserted between the test port and the tuning section.

7. An electro-magnetic signal sampling assembly as in claim 6, comprising a test setup in which the device under test (DUT) is connected to said impedance tuner and to a signal source and power meter; the electric and magnetic sensors being connected to a high speed oscilloscope to measure the voltage and current propagating between said DUT and the impedance tuner.

8. An electro-magnetic signal sampling assembly as in claim 6, wherein said oscilloscope is calibrated on each of its channels in amplitude and phase at the fundamental and all harmonic frequencies.

9. An electro-magnetic signal sampling assembly as in claim 7, wherein said oscilloscope is calibrated by connecting an RF signal at the fundamental (Fo) and harmonic frequencies (2Fo, 3Fo, 4Fo, 5Fo...) to each channel of said oscilloscope individually and measuring the response, registering the deviation between responses and correcting for deviations of the amplitude and the relative phase between channels.

10. An electro-magnetic signal sampling assembly as in claim 9, wherein said RF signal is connected to said channels of the oscilloscope by means of a SP4T (single pole four throw) RF switch; said RF switch is calibrated for each position by measuring its transmission coefficient at the fundamental and harmonic frequencies using a vector network analyzer and the result is corrected for each channel to the common port of said RF switch.

11. An electro-magnetic signal sampling assembly as in claim 5, further comprising wherein the electric and magnetic sensors are connected to the input ports of an oscilloscope and the signal is measured at the ports of said oscilloscope when said slabline of said signal sampling assembly is matched at its idle port with the characteristic impedance Zo (typically 50Ω); and a known RF power is injected into the test port of said assembly using a matched signal source at the fundamental (Fo) and all harmonic frequencies (2Fo, 3Fo, 4Fo, 5Fo...); and calculating signal transfer factors from said signal sampling assembly test port to the input ports of said oscilloscope as the ratio between injected RF power and power measured at the ports of said oscilloscope.

12. An electro-magnetic signal sampling assembly as in claim 11, wherein signal samples are retrieved by said oscilloscope as a function of time (time domain), which is connected to said electric and magnetic field sensors correspondingly;

said time domain signals samples are converted into a series of harmonic components (frequency domain) using the fast Fourier transformation method (FFT), the results of amplitude and phase of the harmonic frequency components being then corrected by said transfer factor at the fundamental and harmonic frequencies.

13. An electro-magnetic signal sampling assembly as in claim 12, wherein said harmonic frequency components are multiplied with a transmission matrix of a test fixture between a DUT reference plane and the slabline test port; said test fixture include a housing of the DUT connected to said sensor assembly.

14. An electro-magnetic signal sampling assembly as in claim 13, wherein said harmonic frequency components are processed using the Inverse Fourier transformation method ($FFT^{-1}$) and converted into the real time voltage and current data at the DUT reference plane.

15. An electro-magnetic signal sampling assembly as in claim 14, wherein said current as a function of voltage at said DUT reference plane results in the load line of said DUT.

16. An electro-magnetic signal sampling assembly as in claim 15, wherein said impedance tuner allows manipulating the RF impedance and measuring, calculating and displaying simultaneously said load line of said DUT.

17. An electro-magnetic signal sampling assembly as in claim 15, wherein said impedance tuner is a multi-probe impedance tuner and allows manipulating the RF impedance at the fundamental and harmonic frequencies separately and measuring simultaneously voltages, currents and said load line of said DUT.

18. An electro-magnetic signal sampling assembly as in claim 15, wherein the signal sampling assembly and impedance tuner are connected at the input side of said DUT and allow manipulating the source impedance and measuring voltages, currents and the load line of said DUT; said signal sampling assembly being inserted between tuner and said DUT.

19. An electro-magnetic signal sampling assembly as in claim 17, wherein said signal sampling assembly is integrated in the housing of said source and load impedance tuner and placed between the test port of said tuner and the probe.

20. An electro-magnetic signal sampling assembly as in claim 1, wherein the angle of the grounded loop of the magnetic field sensor can be varied by rotating said loop around the axis of the coaxial cable carrying said magnetic loop to adjust the magnetic coupling.

* * * * *